United States Patent [19]
Yamagishi

[11] Patent Number: 5,313,043
[45] Date of Patent: May 17, 1994

[54] METHOD AND APPARATUS FOR LASER MACHINING

[75] Inventor: Yasuo Yamagishi, Kawasaki, Japan

[73] Assignee: Fujitsu Limited, Kawasaki, Japan

[21] Appl. No.: 920,926

[22] Filed: Jul. 28, 1992

[30] Foreign Application Priority Data

Aug. 22, 1991 [JP] Japan .................................. 3-211058

[51] Int. Cl.⁵ .............................................. B23K 26/00
[52] U.S. Cl. .......................... 219/121.68; 219/121.74; 219/121.84; 219/121.69
[58] Field of Search ...................... 219/121.68, 121.66, 219/121.73, 121.74, 121.84

[56] References Cited
U.S. PATENT DOCUMENTS

| | | | |
|---|---|---|---|
| 4,405,238 | 9/1983 | Grobman et al. | 356/401 |
| 4,661,679 | 4/1987 | Pardee | 219/121.64 X |
| 5,019,074 | 5/1991 | Muller | 219/121.69 X |
| 5,142,120 | 8/1992 | Hanson et al. | 219/121.83 |

Primary Examiner—C. L. Albritton
Attorney, Agent, or Firm—Staas & Halsey

[57] ABSTRACT

An equipment for excimer laser ablation machining provided a laser (11), a main body (14) housing a mirror (12) for reflecting an ultraviolet ray emitted by the laser and an optical system (13) for arranging the ultraviolet ray to a parallel ray, and a means (15) for moving the relative position of an object to be machined and the parallel ray, the means (15) being a supporter of an object to be machined and having a means (16) for arranging a dielectric mirror mask (7), leaving a space of 0.1 mm through 50 mm, preferably 0.1 mm through 1 mm, between the object to be machined and the dielectric mirror mask (7), the equipment to be employed specifically for producing a via hole of a multi-layered circuit board, and a method for excimer laser ablation machining conducted by employing the foregoing equipment.

15 Claims, 9 Drawing Sheets

METHOD AND APPARATUS FOR LASER MACHINING

BACKGROUND OF THE INVENTION

This invention relates to an equipment for laser machining and a method for laser machining. Specifically, this invention relates to employable for laser a method and apparatus for laser ablation machining. More specifically, the invention relates to a method and apparatus for laser ablation machining using a dielectric mirror mask. Particularly, the invention relates to employable for laser ablation machining conducted for the purpose to produce a via hole to the insulator layer of a multi-layered circuit board and a method for laser ablation machining for the purpose of producing a via hole in the insulator layer of a multi-layered circuit board.

Infrared ray laser machining employing YAG lasers, or $CO_2$ lasers or the like rays one of the infrared rays is widely known. Since laser machining employing infrared rays depends on thermal energy, such machining has a drawback in that it may cause thermal damage to objects; in the neighborhood of the machined area. Moreover, since infrared ray laser machining involves the use of a laser beam having a small cross-sectional area which is scanned along a surface to be machined, it is difficult to increase the machining rate. Furthermore, since it is difficult to confine infrared rays to; a beam having a small cross-sectional area, laser machining employing infrared rays is not suitable for micro machining of the sort necessary for producing via holes.

In order to achieve micro machining, a laser ablation machining procedure employing an excimer laser was developed. An excimer laser is a gas laser which emits strong ultraviolet rays depending on excitons of a rare gas and a halogen. The ordinary strength of an excimer laser is approximately 100 MW/cm$^2$ at the peak of pulse. Since ordinary substances readily absorb ultraviolet rays, irradiation with ultraviolet rays generated by an excimer laser generally may result in the instant dissolution and vaporization of; the surface of the irradiated substance. Laser ablation machining employs this phenomenon. Excimer lasers such as KrF lasers are widely employed laser (248 nm), XeCl lasers (308 nm) and ArF lasers (193 nm).

Laser ablation machining has the following advantages:

1. Since laser ablation does not employ thermal energy but rather depends on dissolution of chemical bonds by the generated excimer laser ultraviolet rays, the finished shapes are arcuracte and beautiful;
2. Since laser ablation does not employ a laser beam but rather employs a broad laser flux which is assisted by a mask, accurate machining is readily achieved;
3. In particular, ArF lasers are suitable for machining polymers such as polyimide resins and the like.

Production of via holes in the insulator layer of multi-layered circuit boards is one of the promising uses for laser ablation machining.

A multi-layered circuit board which is available in the prior art is illustrated in FIG. 1. Referring to FIG. 1, insulator layers 22 and conductor layers 23 are piled alternately on a substrate 21, and the conductor layers 23 are connected with each other through via holes 24. Although a serial process has been developed for producing multi-layered circuit boards, such serial process has not yet been completely accepted, because of difficulty in forming via holes when such process is used.

This is because certain types of polymers for example polyimide resin and the like, are preferably employed as the construction material for the insulator layers of such multi-layered circuit boards and these polymers are difficult to machine for the following reasons.

1. When such polymers are exposed to light, they do not necessarily allow light to penetrate all the way to the bottom of the layer, and as a result the accuracy of the via hole thus produced is unsatisfactory.
2. Such polymers do not allow for the production of via holes having an; aspect ratio greater than 3 when a wet etching process is employed.
3. It is difficult to obtain suitable photoresists for use in etching such polymers, and such etching processes are extremely complicated.

On the other hand, when excimer laser ablation machining is employed via holes having a high aspect ratio may be produced by a fairly simple process.

Excimer laser ablation machining is classified into two categories, one is known as the contact mask process, e.g. Siemens' "7500H90" process and the other is known as the projection process, e.g. IBM's "ES9000" process.

An example of the contact mask process will be described below with reference to the drawing.

Referring to FIG. 2, a polyimide resin layer 22a and a copper film 25 are laminated on a ceramic substrate 21a.

Referring to FIG. 3, a photoresist is coated on the copper film 25 to thus produce a photoresist layer 26. The photoresist layer 26 is selectively exposed to ultraviolet rays through a mask 27.

Referring to FIG. 4, the photoresist layer 26 is converted to an etching mask 26a by a developing process.

Referring to FIG. 5, the copper film 25 is converted to an etching mask 25a by an etching process employing the etching mask 26a of the photoresist layer 26 as a mask.

Referring to FIG. 6, a strong ultraviolet ray beam emitted by an excimer laser 11, e.g. a KrF laser, is irradiated into the polyimide resin layer 22a via a mirror 12, a lens 27 and the etching mask 25a of the copper film 25.

In this process, the intensity of each pulse of the ultraviolet ray beam irradiated onto the polyimide resin layer 22a must exceed 0.5 J/cm$^2$. Therefore, the etching mask 25a is required to be a metal plate having a thickness larger than 0.2 mm. On the other hand, the required diameter of a via hole is 10 to 200 micrometers, in order for the produced via hole to have; a high aspect ratio. It is well known that via holes having high aspect ratios are difficult to produce. Moreover, the foregoing complicated lengthy process necessary for the contact mask process is a considerable drawback which can not be ignored.

An example of the projection process will next be described with reference to the drawings.

Referring to FIG. 7, a polyimide resin layer 22a is coated onto a ceramic substrate 21a, and an object to be machined is produced.

Referring to FIG. 8, an electric discharge machining process or photolithography is employed to convert a metal plate having a thickness of 0.1 to 0.3 mm into a metal mask 28 having an enlarged pattern consisting of openings 28a.

Referring to FIG. 9, the metal mask 28 is arranged in parallel to a lens 27a and to the object to be machined consisting of the ceramic substrate 21a with the polyimide resin layer 22a, and a mirror 12a which reflects a strong ultraviolet ray beam emitted by an excimer laser 11, e.g. a KrF laser, moves along a plane parallel to the metal mask 28. When the mirror 12a moves along the metal mask 28, the strong ultraviolet ray beam emitted by the excimer laser 11 is scanned along the surface of the polyimide resin layer 22a through the metal mask 28. In this process, the enlarged pattern of the metal mask is reduced by the lens 27a before being copied in the polyimide resin layer 22a by the excimer laser ablation phenomenon.

In this process, it is not easy to produce the metal mask 28 because such a metal plate is readily warped during the production process. Further, this process has a drawback because the maximum dimension of a frame in which one scanning pass of excimer laser ablation is allowed can not exceed 40 mm in diameter, thus requiring a large number of steps to be repeated for patterning the entire surface of the polyimide resin layer 22a.

The foregoing description clearly shows that both the contact mask process and the projection process are involved with drawbacks which need to be removed.

A thin mask which has a small absorption factor and a large reflection factor and is durable against irradiation by the strong ultraviolet ray beam emitted by an excimer laser, is assumed effective to improve the excimer laser ablation machining process.

In the meantime, it is known that a mask which is durable against a strong ultraviolet ray beam due to the large reflection factor is a dielectric mirror mask which is defined as a mask made of a dielectric mirror which is further defined as a piled plate in which two kinds of layers having refraction factor different from each other are alternately piled.

SUMMARY OF THE INVENTION

Therefore, the first object of this invention is to provide apparatus employable for laser ablation machining.

A second object of this invention is to provide apparatus employable for conducting laser ablation machining for the purpose of producing a multi-layered circuit board.

A third object of this invention is to provide a method for laser ablation machining.

A fourth object of this invention is to provide a method for conducting laser ablation machining for the purpose of producing a multi-layered circuit board.

To achieve the foregoing first object of this invention, apparatus for laser ablation machining is provided. The apparatus includes
 (a) a laser (11),
 (b) a main body (14) housing a mirror (12) for reflecting the ultraviolet ray (L) emitted by the laser (11) and an optical system (13) for forming the ultraviolet ray (L) into a parallel ultraviolet ray, and
 (c) a mechanism (15) for moving the relative position of an object to be machined and the parallel ultraviolet ray for machining the object to be machined. The mechanism provides the support for the object to be machined and includes an arrangement (16) for positioning a dielectric mirror mask (7) in parallel with the upper surface of the object to be machined and so as to present a space between the upper surface of the object to be machined and the lower surface of the dielectric mirror mask (7).

In the foregoing apparatus employable for laser ablation machining, the laser (11) can be an excimer laser.

In the foregoing apparatus employable for laser ablation machining, the excimer laser can be a krypton fluoride laser, a xenon chloride laser, or an argon fluoride laser.

In the foregoing apparatus employable for laser ablation machining, the dielectric mirror mask (7) can be made of quartz, yttriumoxide or calcium fluoride.

In the foregoing apparatus employable for laser ablation machining, the space between the upper surface of the object to be machined and the dielectric mirror mask (7) may be 0.1 mm to 50 mm, and more preferably may be 0.1 mm to 1 mm in thickness through 1 mm.

To achieve the foregoing second object of this invention, the object to be machined is a multi-layered circuit board and the specific portions to be machined are via holes penetrating the insulator layers of the multi-layered circuit board.

To achieve the third object of this invention, a method for laser ablation machining is provided wherein the foregoing apparatus for laser ablation machining is employed for laser ablation machining in accordance with this invention.

In the foregoing method for laser ablation machining, the laser (11) can be an excimer laser, and more preferably may be a krypton fluoride laser, a xenon chloride laser, or an argon fluoride laser.

In the foregoing method for laser ablation machining, the dielectric mirror mask (7) can be made of quartz, yttriumoxide or calcium fluoride.

In the foregoing method for laser ablation machining, the space between the upper surface of the object to be machined and the lower surface of the dielectric mirror mask (7) may be 0.1 mm to 50 mm, and more preferably may be 0.1 mm to 1 mm in thickness.

To achieve the foregoing fourth object of this invention, the object to be machined is a multi-layered circuit board and the specific portions to be machined are via holes penetrating the insulator layers of the multi-layered circuit board.

DETAILED DESCRIPTION OF A PREFERRED EMBODIMENT OF THIS INVENTION

Figure 1:
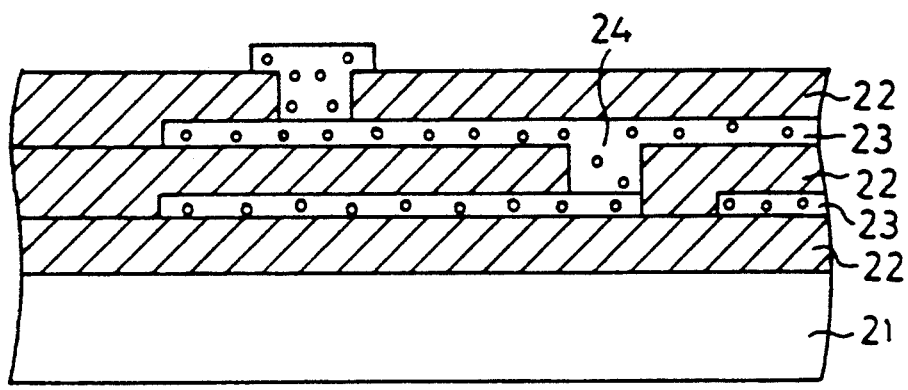
FIG. 1 is a cross-sectional view of a multi-layered circuit board available in the prior art.
Figure 2:
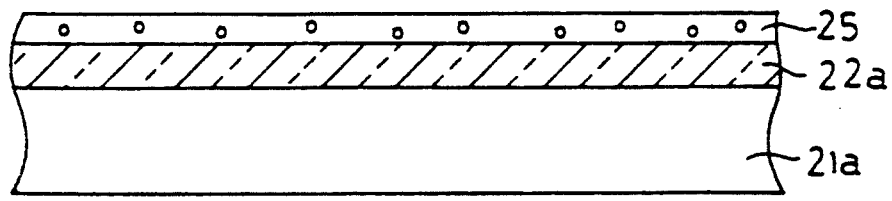
FIG. 2 is a cross-sectional view of a substrate illustrating the first step of a contact mask process available in the prior art.
Figure 3:
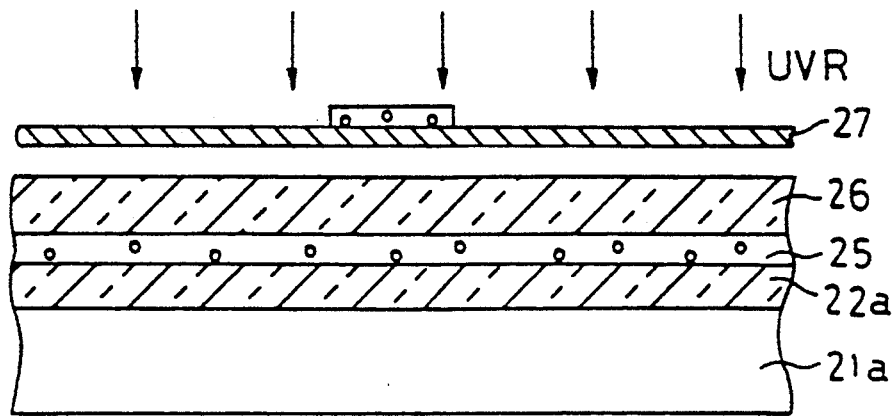
FIG. 3 is a cross-sectional view of a substrate illustrating the second step of a contact mask process available in the prior art.
Figure 4:
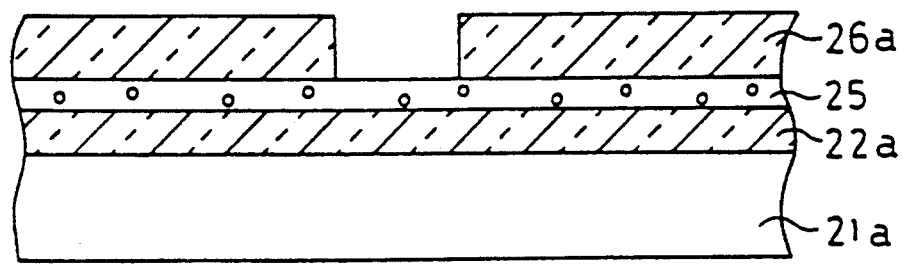
FIG. 4 is a cross-sectional view of a substrate illustrating the third step of a contact mask process available in the prior art.
Figure 5:
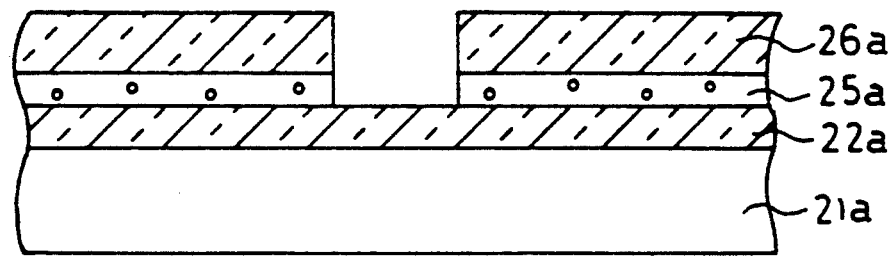
FIG. 5 is a cross-sectional view of a substrate illustrating the fourth step of a contact mask process available in the prior art.
Figure 6:
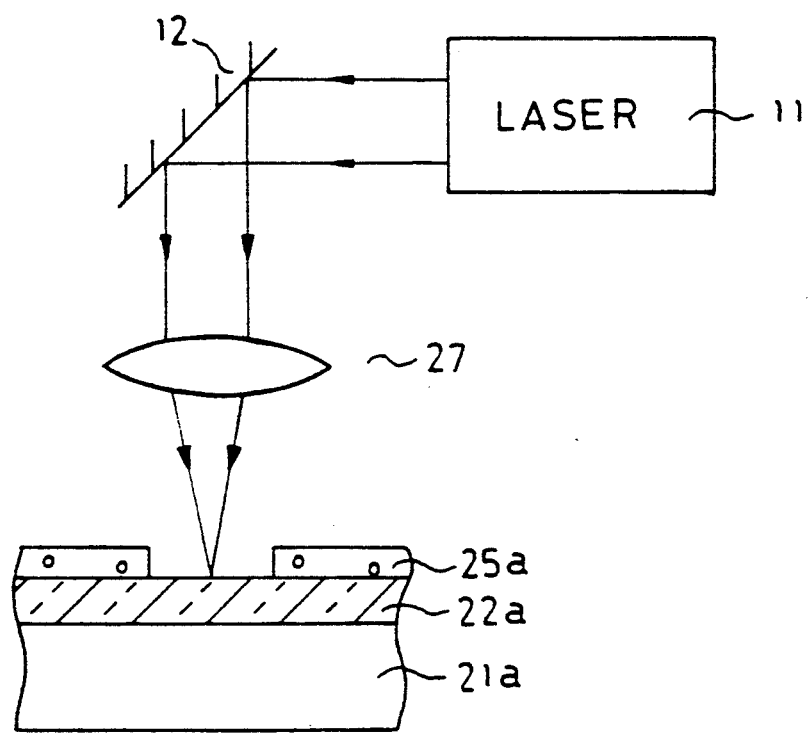
FIG. 6 is a schematic elevational view illustrating a contact mask process available in the prior art.
Figure 7:
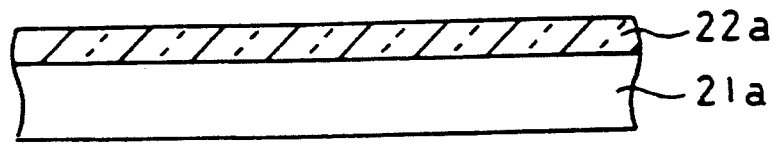
FIG. 7 is a cross-sectional view of an object to be machined by a projection process available in the prior art.
Figure 8:
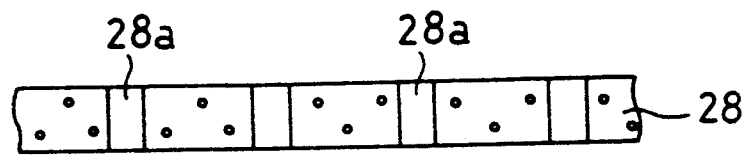
FIG. 8 is a cross-sectional view of a metal mask employable for a projection process available in the prior art.
Figure 9:
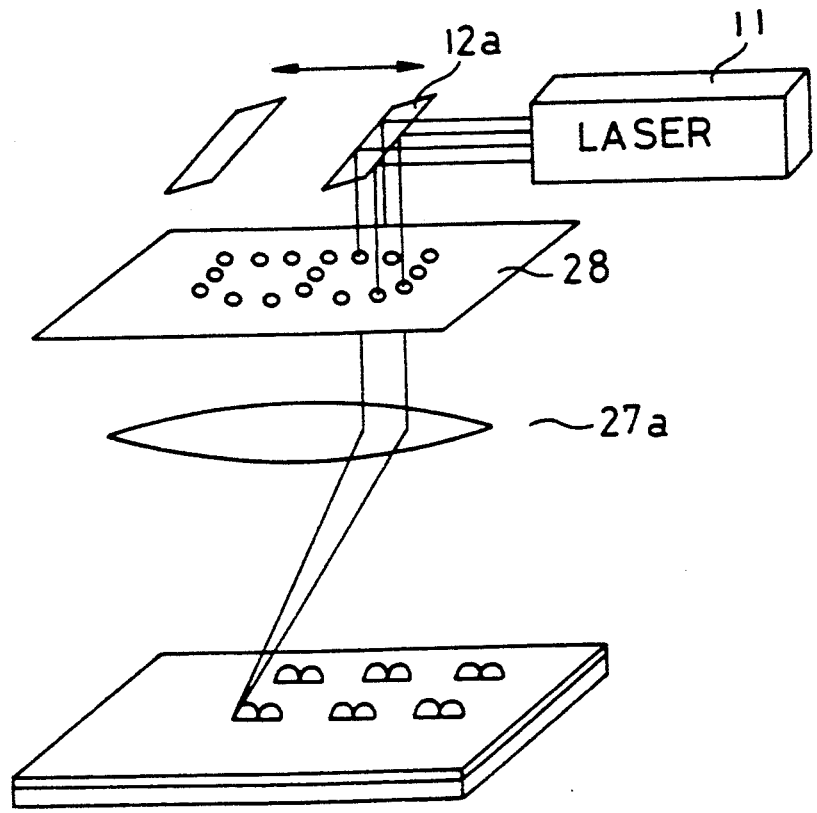
FIG. 9 is a schematic drawing illustrating the main step of a projection process available in the prior art.

Referring to the drawings, an apparatus and a method for excimer laser ablation machining conducted with the assistance of a dielectric mirror mask specifically for the purpose of producing a via hole in the insulator layer of a multi-layered circuit board, will be described below.

A. PRODUCTION OF A DIELECTRIC MIRROR MASK

Figure 10:
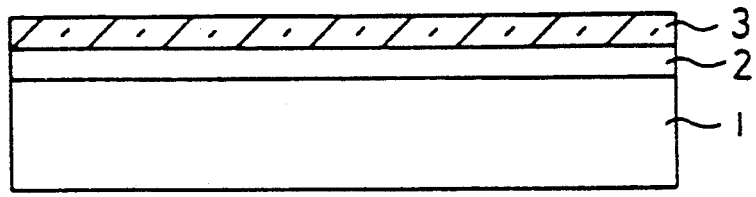
FIG. 10 is a cross-sectional view of a crystal glass substrate illustrating the first step of a process for producing a dielectric mirror mask in accordance with this invention.

Referring to FIG. 10, a Ni/Cu layer 2 having a thickness of 1.2 micrometers is produced on a crystal glass substrate 1 by an evaporation process. Photoresist is coated on the Ni/Cu layer 2 to thereby produce a photoresist layer 3.

Figure 11:
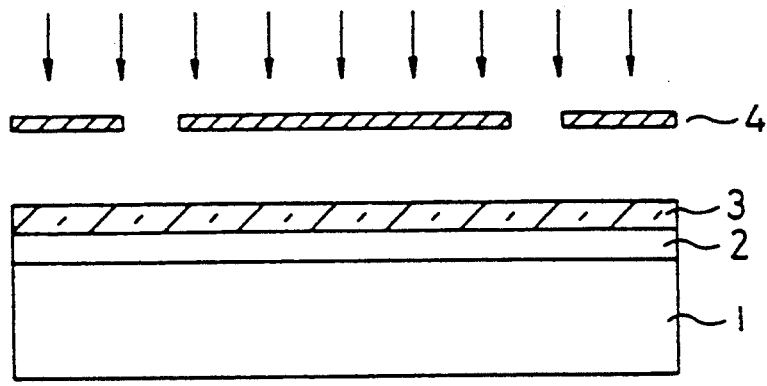
FIG. 11 is a cross-sectional view of a crystal glass substrate illustrating the second step of a process for producing a dielectric mirror mask in accordance with this invention.

Referring to FIG. 11, specific areas of the photoresist layer 3 are selectively exposed to an ultraviolet ray through a mask 4 having a pattern of via holes.

Figure 12:
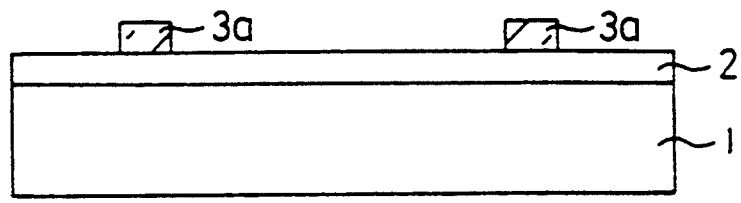
FIG. 12 is a cross-sectional view of a crystal glass substrate illustrating the third step of a process for producing a dielectric mirror mask in accordance with this invention.

Referring to FIG. 12, the photoresist layer 3 is converted to an etching mask 3a by a developing process.

Figure 13:
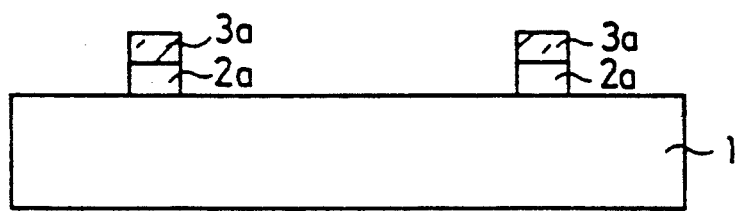
FIG. 13 is a cross-sectional view of a crystal glass substrate illustrating the fourth step of a process for producing a dielectric mirror mask in accordance with this invention.

Referring to FIG. 13, the Ni/Cu layer 2 is converted to an etching mask 2a by an etching process conducted by using the etching mask 3a of the photoresist layer 3.

Figure 14:
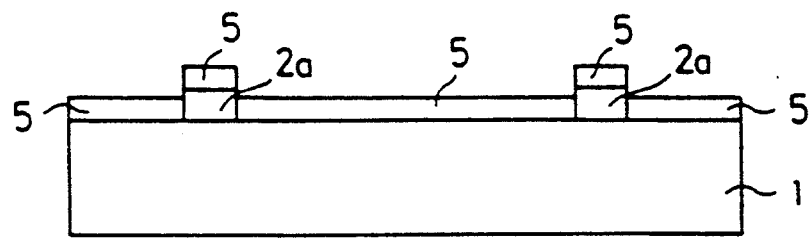
FIG. 14 is a cross-sectional view of a crystal glass substrate illustrating the fifth step of a process for producing a dielectric mirror mask in accordance with this invention.

Referring to FIG. 14, the etching mask 3a is removed, is deposited on the substrate 1 and the mask 2a. The plate 5 includes a piled plate 5 in which approximately 15 layers each of quartz and yttriumoxide, which layers are alternately piled by conducting an evaporation process. The preferable thickness of the piled plate 5 is 1 micrometer.

Figure 15:
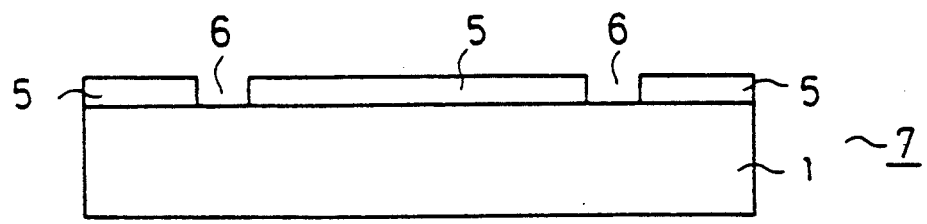
FIG. 15 is a cross-sectional view of a crystal glass substrate illustrating the sixth step of a process for producing a dielectric mirror mask in accordance with this invention.

Referring to FIG. 15, the etching mask 2a of Ni/Cu layer 2 is removed leaving an opening 6 having a diameter of 40 micrometers and being located at a location corresponding to the via hole. In this manner, a dielectric mirror mask 7 is produced.

The reflection factor and the refraction factor of the dielectric mirror mask 7 were determined to be respectively 99% and 0.1%, when examined with an ultraviolet ray having a wave length of 248 nm.

A dielectric mirror is a piled plate in which two kinds of layers having refraction factors different from each other are alternately piled. Based on the Bragg reflection phenomenon, such mirror realizes a very high value of reflection factor, when the condition of Bragg reflection is satisfied or a formula, $$\pi + 2\pi(2nd/\lambda) = 2\pi \text{ is satisfied,}$$

wherein:
n is the refraction factor of the layers,
d is the thickness of the layers, and
$\lambda$ is the wave length of light, provided the light is irradiated in the direction perpendicular to the surface of the mirror. The reflection factor is increasingly larger, following an increase in the number of piled layers. When a mask is produced from such dielectric mirror, the mask reflects almost the entire amount of light and absorbs only a very little amount of heat energy. As a result, the mask is hardly damaged. Insofar as far-ultraviolet radiation is concerned, quartz, yttriumoxide, calcium fluoride etc. are good materials for producing a dielectric mirror. Therefore, a combination of quartz and yttriumoxide was employed with a crystal glass substrate in the foregoing embodiment.

Although dielectric mirrors have been used to reflect excimer laser rays, such mirrors have never been used as a mask for laser ablation machining. The reasons for this are assumed to be as follows.

Since a laser ablation machining process causes an object to be machined to be vaporised, a considerable quantity of gas is generated. If a laser ablation machining process is conducted with a dielectric mirror mask arranged in contact with an object to be machined, the gas stays in the neighborhood of the object to be machined, thereby causing accurate machining to be difficult.

B. EQUIPMENT FOR LASER ABLATION MACHINING

Figure 16:
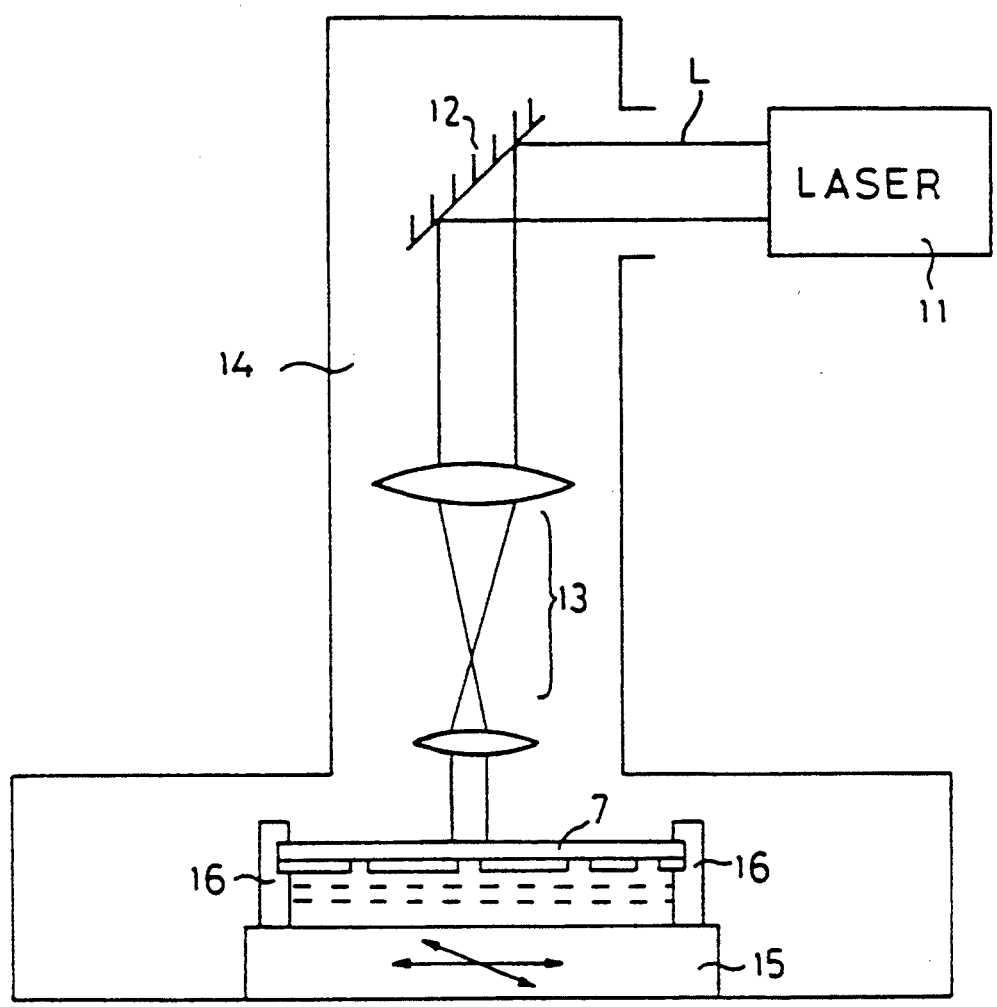
FIG. 16 is a schematic elevational view illustrating apparatus for laser ablation machining in accordance with this invention.

Referring to FIG. 16, the ultraviolet ray L emitted by an excimer laser, e.g. a KrF laser 11, is reflected by a mirror 12 and is arranged into a parallel light form by an optical system 13. The mirror 12 and the optical system 13 are housed in a main body 14. An X-Y table 15 is allowed to move with respect to the main body 14 in a plane perpendicular to the ultraviolet ray L. The X-Y table 15 works as a supported for supporting an object to be machined. The X-Y table 15 is provided with a mechanism 16 for supporting a dielectric mirror mask 7 in a plane parallel to the upper surface of the object to be machined and in a position such that a space is maintained between the upper surface of the object to be machined and the lower surface of the dielectric mirror mask 7. The vertical dimension of the space can be selected so as to be 0.1 mm to 5 mm, and more preferably so as to be 0.1 mm to 1 mm.

C. METHOD FOR LASER ABLATION MACHINING

A process for producing via holes in a polyimide resin layer employing a method for laser ablation machining in accordance with this invention will be described below.

1. PREPARATION OF TEST PIECES

Figure 17:
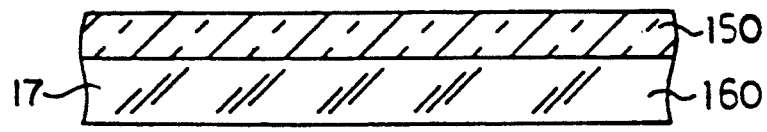
FIG. 17 is a cross-sectional view of a test piece to be patterned by the apparatus for laser ablation machining in accordance with this invention.

Referring to FIG. 17, a layer 150 of a polyimide resin (PIX-3500 produced by Hitachi Kasei Co.) was coated on a glass substrate 160 and a test piece 17 which is the 160 piled by a polyimide resin layer 150 having a thickness of 35 micrometers was produced.

2. FIRST TRIAL WITH GAP OF 0.3 mm

Figure 18:
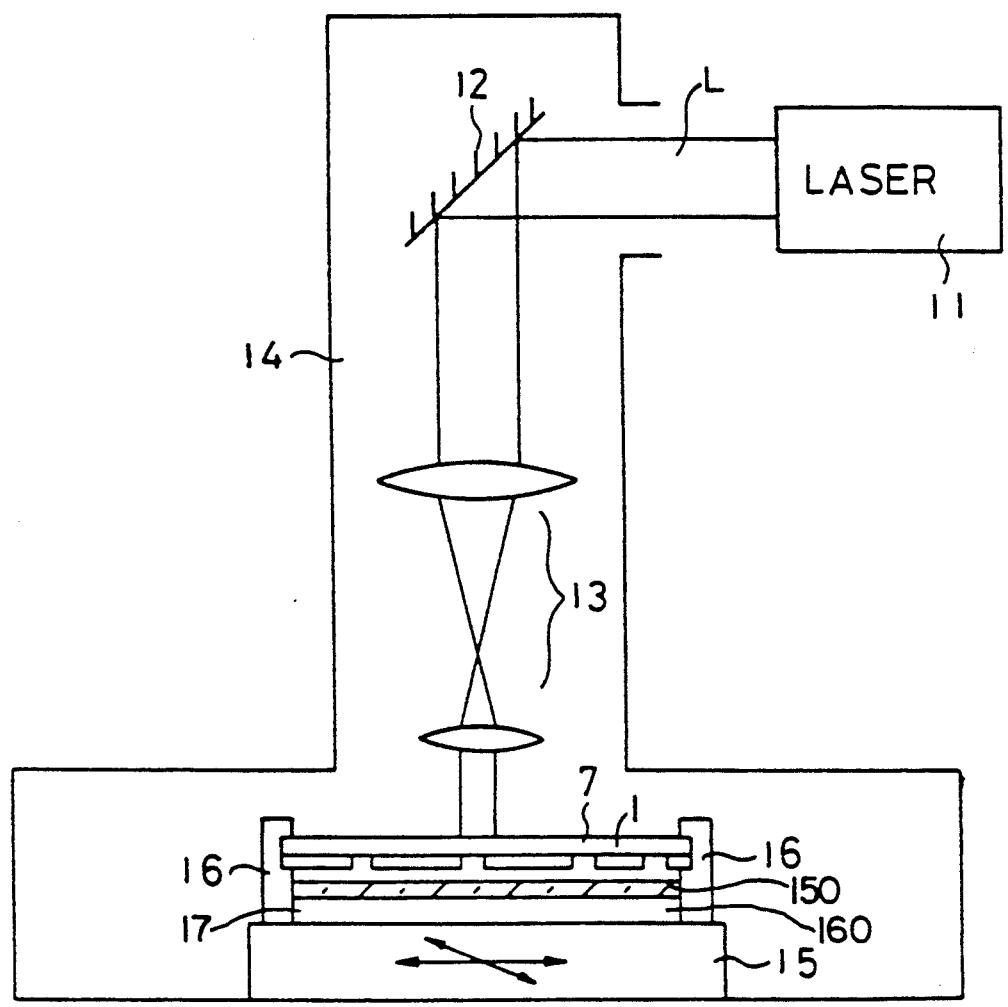
FIG. 18 is a schematic elevational view illustrating the laser ablation machining process in accordance with this invention.

Referring to FIG. 18, the test piece 17 and the dielectric mirror mask 7 were assembled to the foregoing apparatus for laser ablation machining in accordance with this invention. In this case, the distance between the upper surface of the test piece 17 and the lower surface of the dielectric mirror mask 7 was selected to be 0.3 mm.

A laser ablation machining process was conducted more than 300 the conditions tabulated below.
  a. Wavelength of the laser employed: 248 nm (KrF)
  b. Power of the laser employed: 250 mJ/pulse of width of 16 nano sec.
  c. Power irradiated: 1.01 $Jcm^{-2}$/pulse
  d. Pulse rate: 200 pulses/cycle The foregoing trial determined that more than 300 via holes having diameters of 40 to 100 micrometers were produced with very good accuracy.

The reason for this successful machining is assumed to be that the gas generated by dissolution of polyimide resin was purged smoothly from the neighborhood of the object to be machined and the dielectric mirror mask.

3. SECOND TRIAL WITH GAP OF 0.1 mm

A similar process was conducted with the distance between the upper surface of the test piece and the lower surface of the dielectric mirror mask being set at 0.1 mm.

This trial determined that via holes having diameters of 10 to 50 micrometers were produced with very good accuracy.

4. THIRD TRIAL WITH GAP OF 0.08 mm

A similar process was conducted with the distance between the upper surface of the test piece and the lower surface of the dielectric mirror mask being set at 0.08 mm.

Figure 19:
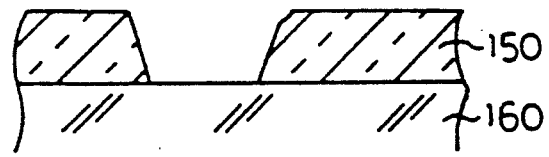
FIG. 19 is a schematic cross-sectional view illustrating the finished shape patterned by a process in accordance with the invention, wherein the gap is selected to 80 micrometers.

This trial determined that upper edges of the via holes were damaged for some of the via holes, as is illustrated in FIG. 19. The damaged dimension was less than 1 micrometer for holes having a diameter of 15 micrometers, the holes having been formed employing a mask with openings having a diameter of 13 micrometers.

The reason for this successful machining is assumed to be identical to that for the first trial where the gap was 0.3 mm.

5. FOURTH TRIAL WITH GAP OF 0.05 mm

A similar process was conducted with the distance between the upper surface of the test piece and the lower surface of the dielectric mirror mask being set at 0.05 mm.

Figure 20:
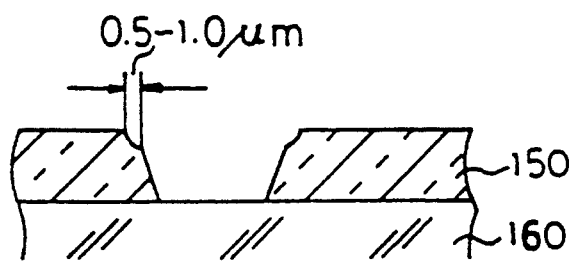
FIG. 20 is a schematic cross-sectional view illustrating the finished shape patterned by a process in accordance with the invention, wherein the gap is selected to be 50 micrometers.

This trial determined that the upper edges of the via holes were damaged for almost all via holes, as is illustrated in FIG. 20. The damaged dimension varies from 0.5 to 1.0 micrometers, when a mask having an opening having a diameter of 13 micrometers was used. In addition, the surface of the crystal glass substrate 1 of the dielectric mirror mask 7 was slightly damaged.

This establishes that a gap of 0.1 mm between the dielectric mask and the object to be machined is the threshold value for successful machining.

6. FIFTH TRIAL WITH NO GAP

A similar process was conducted with no gap between the test piece and the dielectric mirror mask.

Figure 21:
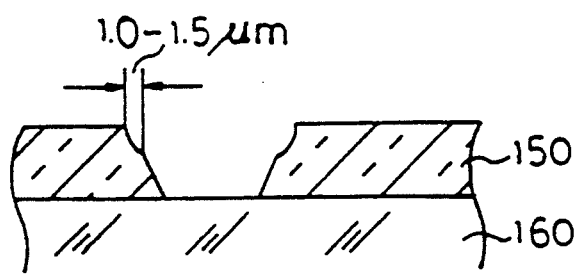
FIG. 21 is a schematic cross-sectional view illustrating the finished shape patterned by a process in accordance with the invention, wherein the object being machined is in contact with the dielectric mirror mask.

This trial determined that the upper edges of the via holes were damaged for all the via holes, as is illustrated in FIG. 21. The damaged dimension varies from 1.0 to 1.5 micrometers, provided a mask having an opening diameter of 13 micrometers was employed. In addition, the surface of the crystal glass substrate 1 of the dielectric mirror mask 7 is damaged to a considerable extent.

Following the foregoing experimental results, it is concluded that a hole having a small diameter can be produced in an insulator layer by employing an excimer laser ablation machining process with assistance from a dielectric mirror mask having a dimension which is identical to that of the object to be machined, provided the dielectric mirror mask is arranged so as to leave a space having a width of 0.1 mm or larger between the dielectric mirror mask and the object to be machined.

The foregoing description has clarified that this invention has successfully provided an apparatus and a method for excimer laser ablation machining specifically to be conducted for the purpose of producing a via hole in the insulator layer of a multi-layered circuit board.

Although the foregoing description was presented referring to specific embodiments, this is not meant to be construed in a limiting sense. Various modifications of the disclosed embodiment, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A laser machining method employing an ultraviolet ray emitted by a laser, comprising:
    optically converting the ultraviolet ray emitted by the laser to a parallel ultraviolet ray, travelling in a first direction;
    supporting an object for selective movement in desired directions in a plane substantially transverse to the first direction and such that an upper surface of the object, to be machined, is maintained substantially in parallel with the plane;
    selectively moving the object in desired directions in the plane thereby to selectively change the position on the surface of the object on which the parallel ultraviolet ray is irradiated; and
    supporting a dielectric mirror mask of planar configuration in parallel relationship with respect to the upper surface of the object to be machined and with a space between the upper surface of the object and the lower surface of the planar dielectric mirror mask and such that the dielectric mirror mask remains in a fixed position relative to the upper surface of the object to be machined during selective movement of the object.

2. An apparatus for laser machining an object, said apparatus comprising:
- a laser for emitting an ultraviolet ray;
- a housing;
- a mirror mounted in the housing for reflecting ultraviolet rays emitted by the laser;
- an optical system for converting the emitted ultraviolet rays into a parallel ultraviolet beam;
- a dielectric mirror mask for patterning the parallel ultraviolet beam; and
- a support and traverse mechanism for supporting an object to be machined in the path of the parallel ultraviolet beam during a machining operation,
- said mechanism being operable for moving the object in a direction perpendicular to the beam during a machining operation,
- said mirror mask being supported by said mechanism in a position above the object with a vapor purging space defined between the mask and the object being machined.

3. An apparatus for laser machining as set forth in claim 2, wherein said laser is an excimer laser.

4. An apparatus for laser machining as set forth in claim 3, wherein said excimer laser is a krypton fluoride laser, a xenon chloride laser or an argon fluoride laser.

5. An apparatus for laser machining as set forth in claim 2, wherein said dielectric mirror mask is formed from a combination of two different compounds selected from among quartz, yttriumoxide and calcium fluoride.

6. An apparatus for laser machining as set forth in claim 2, wherein said space provides a distance of 0.1 to 50 mm between said mask and the object being machined.

7. An apparatus for laser machining as set forth in claim 6, wherein said distance is 1 mm or less.

8. An apparatus for laser machining as set forth in claim 2, wherein said object being machined is an insulator of a multi-layered circuit board.

9. A method for laser machining as set forth in claim 1, wherein said laser is an excimer laser.

10. A method for laser machining as set forth in claim 9, wherein said excimer laser is a krypton fluoride laser, a xenon chloride laser or an argon fluoride laser.

11. A method for laser machining as set forth in claim 1, wherein said dielectric mirror mask is formed from a combination of two different compounds selected from among quartz, yttriumoxide and calcium fluoride.

12. A method for laser machining as set forth in claim 1, wherein said space provides a distance of 0.1 to 50 mm between said mask and the object being machined.

13. A method for laser machining as set forth in claim 12, wherein said distance is 1 mm or less.

14. A method for laser machining as set forth in claim 1, wherein said object being machined is an insulator of a multi-layered circuit board.

15. A method for laser machining as set forth in claim 1, wherein said object is a multi-layered circuit board comprising an insulation layer, and wherein said method comprises forming via holes in said insulation layer using said parallel ultraviolet ray.

* * * * *

UNITED STATES PATENT AND TRADEMARK OFFICE
CERTIFICATE OF CORRECTION

PATENT NO. : 5,313,043
DATED : May 17, 1994
INVENTOR(S) : YASUO YAMAGISHI

It is certified that error appears in the above-indentified patent and that said Letters Patent is hereby corrected as shown below:

Title page, [57] Abstract of the Disclosure , delete in its entirety and substitute the following:

-- An apparatus for excimer laser ablation machining includes a laser, a housing containing a mirror for reflecting an ultraviolet ray beam emitted by the laser and an optical system for arranging the ultraviolet ray beam into a parallel ray beam. The apparatus further includes a mechanism for supporting and moving an object to be machined relative to the parallel ray beam. The apparatus also includes a dielectric mirror mask which is supported by the mechanism in a position above the object to be machined with a vapor purging space of 0.1 mm to 5 mm, preferably of 0.1 mm to 1 mm being provided between the object to be machined and the dielectric mirror mask. The equipment may specifically be used for producing a via hole in an insulator layer of a multi-layered circuit board. A method for excimer laser ablation machining conducted by employing the foregoing equipment is also disclosed.--

Column 1, line 5, delete "an equipment for laser ma-";

UNITED STATES PATENT AND TRADEMARK OFFICE
CERTIFICATE OF CORRECTION

PATENT NO. : 5,313,043
DATED : May 17, 1994
INVENTOR(S) : YASUO YAMAGISHI

It is certified that error appears in the above-indentified patent and that said Letters Patent is hereby corrected as shown below:

line 7, delete "chining and";
    line 7, after "method" insert --and apparatus--.
    line 8, delete "this" and substitute --the--; and delete "employable for laser".
    line 12, delete "employable".
    lines 13 and 14 delete in their entirety.
    line 15, delete "layered circuit board and" and delete "for" and substitute --and apparatus employing--.

line 19, delete "rays one of the infrared rays".
    line 23, delete ","
    line 28, delete ","
    line 30, after "for" insert --conducting--.
    line 41, delete ";'
    line 43, delete "are"
    line 34 after "(193 nm)" insert --are widely employed--.

UNITED STATES PATENT AND TRADEMARK OFFICE
CERTIFICATE OF CORRECTION

PATENT NO. : 5,313,043
DATED : May 17, 1994
INVENTOR(S) : YASUO YAMAGISHI

It is certified that error appears in the above-indentified patent and that said Letters Patent is hereby corrected as shown below:

line 50, delete "generated" and after "laser" insert --generated--.
      line 67, delete ","
Column 2, line 1, after "polymars" insert --,--
      line 2, delete "resin" and substitute --resins--
      line 5, delete "." and substitute --:--
      line 17, after "employed" insert --,-- line 25, delete "drawing" and substitute --drawings--.
\*       line 42, delete "into" and substitute --onto--.
      line 50, delete ";"
\*       line
\*Column 3, line 1, after "22a" insert --thereon--;
\*       line 60, after "mechanism" insert --(15)--;
      line 61, after "machined" insert --while the relative positions of the object and the ultraviolet ray are being moved--.

UNITED STATES PATENT AND TRADEMARK OFFICE
CERTIFICATE OF CORRECTION

PATENT NO. : 5,313,043
DATED : May 17, 1994
INVENTOR(S) : YASUO YAMAGISHI

It is certified that error appears in the above-indentified patent and that said Letters Patent is hereby corrected as shown below:

```
Column 4, line 12, delete "through 1 mm".
*Column 5, line 35, before "80" insert --be--.
Column 6, line 2, after "moved," insert --and thereafter a
piled plate 5--'
         line 3, delete "a piled plate 5 in which";
         line 20, delete ",".
Column 7, line 18, before "160" insert --glass substrate--;
         line 29, delete "more than 300" and substitute
--under--.
```

Signed and Sealed this

Twenty-first Day of March, 1995

Attest:

BRUCE LEHMAN

*Attesting Officer*     *Commissioner of Patents and Trademarks*